(12) United States Patent
Hiramatsu et al.

(10) Patent No.: US 7,142,023 B2
(45) Date of Patent: Nov. 28, 2006

(54) VOLTAGE DETECTION CIRCUIT

(75) Inventors: Yoshihisa Hiramatsu, Kyoto (JP); Koichi Inoue, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/813,129

(22) Filed: Mar. 31, 2004

(65) Prior Publication Data

US 2004/0196073 A1    Oct. 7, 2004

(30) Foreign Application Priority Data

Apr. 2, 2003   (JP) ............................. 2003-099185

(51) Int. Cl.
*H03K 5/22*   (2006.01)
(52) U.S. Cl. ............................. 327/89; 327/77; 327/78; 327/80
(58) Field of Classification Search ................ 327/143, 327/198, 63, 68, 72, 538, 77
See application file for complete search history.

(56) References Cited

U.S. PATENT DOCUMENTS

| | | | | |
|---|---|---|---|---|
| 4,633,095 A | * | 12/1986 | Komatu ....................... | 327/484 |
| 4,926,283 A | * | 5/1990 | Qualich ...................... | 361/103 |
| 5,059,890 A | * | 10/1991 | Yoshikawa et al. ......... | 323/315 |
| 5,926,062 A | * | 7/1999 | Kuroda ....................... | 327/538 |
| 6,630,858 B1 | * | 10/2003 | Takabayashi ................ | 327/538 |
| 6,661,258 B1 | * | 12/2003 | Huang ......................... | 327/81 |

FOREIGN PATENT DOCUMENTS

JP            3218641          8/2001

\* cited by examiner

*Primary Examiner*—Tuan T. Lam
*Assistant Examiner*—Hiep Nguyen
(74) *Attorney, Agent, or Firm*—Arent Fox PLLC

(57) ABSTRACT

A voltage detection circuit of the invention is composed of the minimum needed number of circuit elements and that permits the temperature characteristic of the reference level for voltage detection to be set arbitrarily. The voltage detection circuit has a first transistor and a second transistor that have the emitters thereof connected together to form a differential pair, a voltage division circuit that divides the input voltage into a first division voltage and a second division voltage, that is connected directly to the base of the first transistor to apply the first division voltage thereto, and that is connected directly to the base of the second transistor to apply the second division voltage thereto, and a resistor that has one end thereof connected to the base of the second transistor and that has the other end thereof connected to the emitter of the second transistor. Whether the input voltage is equal to a predetermined level or not is checked based on the output from the differential pair.

11 Claims, 3 Drawing Sheets

VOLTAGE DETECTION CIRCUIT

This application is based on Japanese Patent Application No. 2003-099185 filed on Apr. 2, 2003, the contents of which are hereby incorporated by reference.

BACKGROUND OF THE INVENTION

1. Field of the Invention

The present invention relates to a voltage detection circuit for checking whether an input voltage is equal to a predetermined level or not.

2. Description of the Prior Art

FIG. 4 shows an example of the configuration of a conventional voltage detection circuit. In the voltage detection circuit shown in FIG. 4, when the voltage $V_{cc}$ applied to an input terminal 5 is higher than a predetermined level $V_{sh}$, the voltage outputted from a terminal 4 is equal to the voltage $V_{cc}$; when the voltage $V_{cc}$ applied to the input terminal 5 is lower than the predetermined level $V_{sh}$, the voltage outputted from the terminal 4 is equal to zero. Moreover, in the voltage detection circuit shown in FIG. 4, the voltage division factor of the voltage division circuit composed of resistors r1 to r3 and a diode-connected transistor Tr1, the base-emitter voltage of a transistor Tr4, the base-emitter voltage of a transistor Tr5, the resistance of a resistor r4, and the resistance of a resistor r5 are so set that the temperature coefficient of the predetermined level $V_{sh}$ is equal to zero. Incidentally, the voltage detection circuit shown in FIG. 4 is disclosed in Japanese Patent Registered No. 3218641.

As described above, in the voltage detection circuit shown in FIG. 4, the voltage division factor of the voltage division circuit composed of the resistors r1 to r3 and the diode-connected transistor Tr1, the base-emitter voltage of the transistor Tr4, the base-emitter voltage of the transistor Tr5, the resistance of the resistor r4, and the resistance of the resistor r5 are so set that the temperature coefficient of the predetermined level $V_{sh}$ is equal to zero. This means that the voltage detection circuit shown in FIG. 4 is absolutely required to be provided with the resistors r1 to r3, the transistor Tr1, the transistor Tr4, the transistor Tr5, the resistor r4, and the resistor r5.

As a result, the voltage detection circuit shown in FIG. 4, in which the temperature coefficient of the predetermined level $V_{sh}$ used as the reference level for voltage detection can be made equal to zero, requires a larger number of circuit elements than a voltage detection circuit in which the reference level for voltage detection varies with temperature. Since an increase in the number of circuit elements constituting a circuit hampers its cost reduction and miniaturization, it is desirable to minimize such an increase in the number of circuit elements used. However, the voltage detection circuit shown in FIG. 4 is not composed of the minimum needed number of circuit elements.

SUMMARY OF THE INVENTION

An object of the present invention is to provide a voltage detection circuit that can be composed of the minimum needed number of circuit elements and that permits the temperature characteristic of the reference level for voltage detection to be set arbitrarily.

To achieve the above object, according to the present invention, a voltage detection circuit is provided with: a first transistor and a second transistor that have the emitters thereof connected together to form a differential pair; a voltage division circuit that divides the input voltage into a first division voltage and a second division voltage, that is connected directly to the base of the first transistor to apply the first division voltage thereto, and that is connected directly to the base of the second transistor to apply the second division voltage thereto; and a resistor that has one end thereof connected to the base of the second transistor and that has the other end thereof connected to the emitter of the second transistor. Here, whether the input voltage is equal to a predetermined level or not is checked based on the output from the differential pair.

With this configuration, the temperature characteristic of the predetermined level (the reference level for voltage detection) can be set arbitrarily by appropriately setting the voltage division factor of the voltage division circuit, the base-emitter voltage of the first transistor, the base-emitter voltage of the second transistor, and the resistance of the resistor that has one end thereof connected to the base of the second transistor and that has the other end thereof connected to the emitter of the second transistor. Moreover, since the voltage division circuit is connected directly to the base of the first transistor and to the base of the second transistor, the voltage detection circuit can be composed of the minimum needed number of circuit elements.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1:
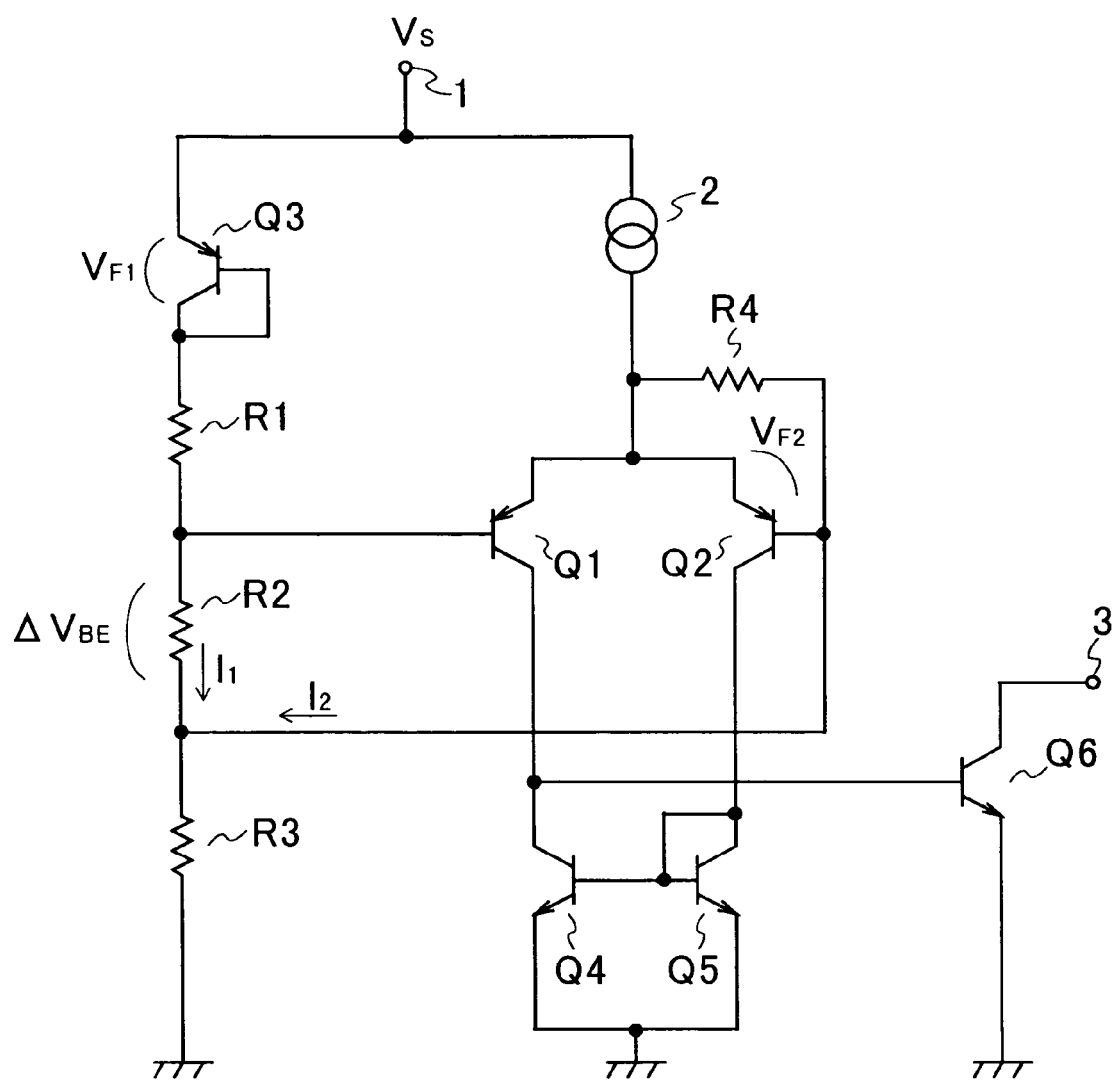
FIG. 1 is a diagram showing an example of the configuration of a voltage detection circuit embodying the invention.

FIG. 1 shows an example of the configuration of a voltage detection circuit embodying the invention. The voltage detection circuit shown in FIG. 1 is composed of an input terminal 1, a constant current source 2, an output terminal 3, PNP-type transistors Q1 to Q3, NPN-type transistors Q4 to Q6, and resistors R1 to R4.

The input terminal 1 is connected to the emitter of the transistor Q3, and is also connected through the constant current source 2 to the emitter of the transistor Q1 and to the emitter of the transistor Q2. The collector of the transistor Q3 is connected, through a serial circuit composed of the resistors R1 to R3, to ground. The collector and base of the transistor Q3 are short-circuited together.

The base of the transistor Q1 is connected directly to the node at which the resistors R1 and R2 are connected together, and the base of the transistor Q2 is connected directly to the node at which the resistors R2 and R3 are connected together. The emitter and base of the transistor Q2 are connected together through the resistor R4.

The collector of the transistor Q1 is connected to the collector of the transistor Q4 and to the base of the transistor Q6, and the collector of the transistor Q2 is connected to the collector of the transistor Q5. The collector and base of the transistor Q5 is short-circuited together, and the base of the transistor Q4 and the base of the transistor Q5 are connected together. The emitter of the transistor Q4 and the emitter of the transistor Q5 are connected together and are connected to ground.

The collector of the transistor Q6 is connected to the output terminal 3, and the emitter of the transistor Q6 is connected to ground.

Configured as described above, the voltage detection circuit shown in FIG. 1 operates as follows. When the voltage applied to the input terminal 1 is lower than a threshold level $V_S$, the potential difference across the resistor R2 is so low that the transistor Q1 is kept on and the transistor Q2 is kept off. This keeps the transistor Q6 on, and thus the output terminal 3 is kept at the ground potential. By contrast, when the voltage applied to the input terminal 1 is higher than the threshold level $V_S$, the potential difference across the resistor R2 is so high that both the transistors Q1 and Q2 are kept on. This keeps the transistor Q6 off, and thus the output terminal 3 is kept in an open state. In this operation of the voltage detection circuit shown in FIG. 1, the threshold level $V_S$ serves as a reference level for voltage detection.

Next, a description will be given of the temperature characteristic of the threshold level $V_S$, i.e., the reference level for voltage detection. Here, let the difference between the base-emitter voltage of the transistor Q1 and the base-emitter voltage of the transistor Q2 as observed when the collector currents of the transistors Q1 and Q2 are in a state of equilibrium be $\Delta V_{BE}$. The voltage $\Delta V_{BE}$ is produced by making the emitter current density of the transistor Q1 and the emitter current density of the transistor Q2 different from each other. The emitter current densities of the transistors Q1 and Q2 can be made different, for example, by giving the transistors Q1 and Q2 different emitter areas.

Let the base-emitter voltage of the transistor Q3 be $V_{F1}$, and let the base-emitter voltage of the transistor Q2 be $V_{F2}$. Let the current that flows through the resistor R2 be $I_1$, let the current that flows from the node at which the resistor R4 and the base of the transistor Q2 are connected together to the node at which the resistors R2 and R3 are connected together be $I_2$, and let the resistances of the resistors R1, R2, R3, and R4 be $R_1$, $R_2$, $R_3$, and $R_4$, respectively.

If it is assumed that the base currents of the transistors Q1 and Q2 can be ignored, threshold level $V_S$, the current $I_1$, and the current $I_2$ are given respectively by Equations (1) to (3) below.

$$V_S = V_{F1} + (R_1+R_2) \cdot I_1 + R_3 \cdot (I_1+I_2) \tag{1}$$

$$I_1 = \Delta V_{BE}/R_2 \tag{2}$$

$$I_2 = V_{F2}/R_4 \tag{3}$$

When Equations (1) to (3) are combined together, the threshold level $V_S$ is given by Equation (4) below.

$$V_S = V_{F1} + (R_1+R_2) \cdot \Delta V_{BE}/R_2 + R_3 \cdot (\Delta V_{BE}/R_2 + V_{F2}/R_4) \tag{4}$$

When the transistors Q2 and Q3 are given identical characteristics so that their base-emitter voltages $V_{F1}$ and $V_{F2}$, respectively, are equal, then the equation $V_{F1}=V_{F2}=V_F$ holds. Hence, Equation (4) above can be rearranged to Equation (5) below.

$$V_s = \Delta V_{BE} \cdot \left(\frac{R_1+R_2+R_3}{R_2}\right) + V_F \cdot \left(\frac{R_3+R_4}{R_4}\right) \tag{5}$$

When Equation (5) above is partially differentiated with respect to the absolute temperature T, Equation (6) below is obtained.

$$\frac{\partial V_s}{\partial T} = \frac{\partial \Delta V_{BE}}{\partial T} \cdot \left(\frac{R_1+R_2+R_3}{R_2}\right) + \frac{\partial V_F}{\partial T} \cdot \left(\frac{R_3+R_4}{R_4}\right) \tag{6}$$

In Equation (6), the first term of the right side has a positive value, and the second term of the right side has a negative value. Thus, by appropriately setting the base-emitter voltages of the transistors Q1 to Q3 and the resistances $R_1$ to $R_4$, it is possible to set the temperature coefficient $\partial V_S/\partial T$ of the threshold level $V_S$ to be any of a positive arbitrary value, a negative arbitrary value, and zero. Normally, the base-emitter voltages of the transistors Q1 to Q3 and the resistances $R_1$ to $R_4$ are so set that the temperature coefficient $\partial V_S/\partial T$ of the threshold level $V_S$ is equal to zero. In a case where the circuit that is connected to the voltage detection circuit shown in FIG. 1 has a temperature characteristic, the base-emitter voltages of the transistors Q1 to Q3 and the resistances $R_1$ to $R_4$ may be so set that the temperature coefficient $\partial V_S/\partial T$ of the threshold level $V_S$ cancels out the temperature characteristic of that circuit.

Figure 2:
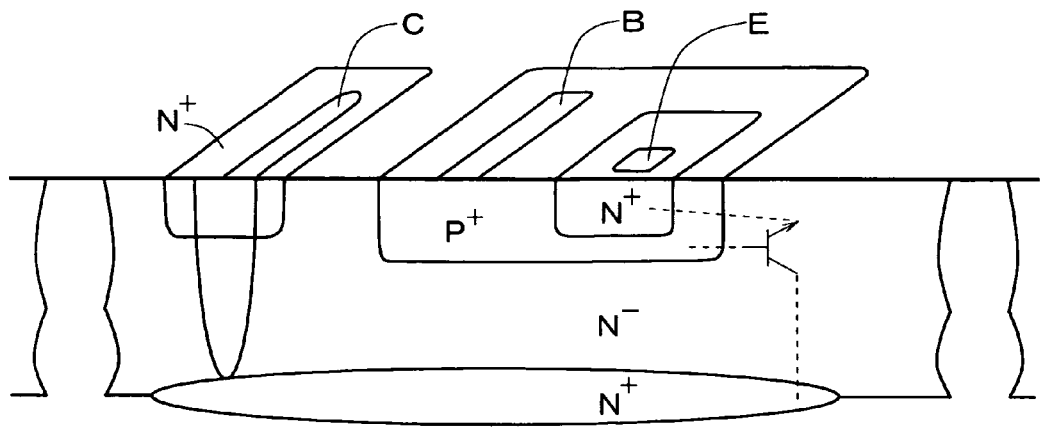
FIG. 2 is a perspective view schematically showing a section of the structure of an NPN-type transistor.
Figure 3:
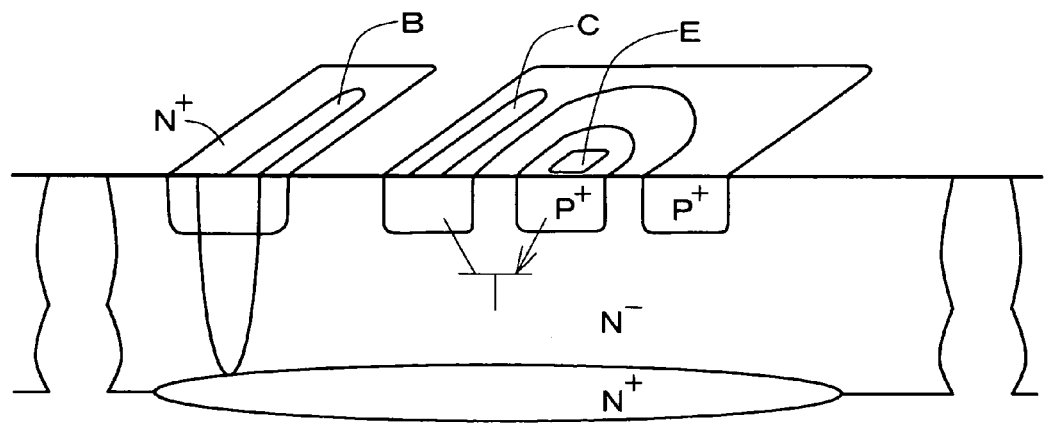
FIG. 3 is a perspective view schematically showing a section of the structure of a PNP-type transistor.
Figure 4:
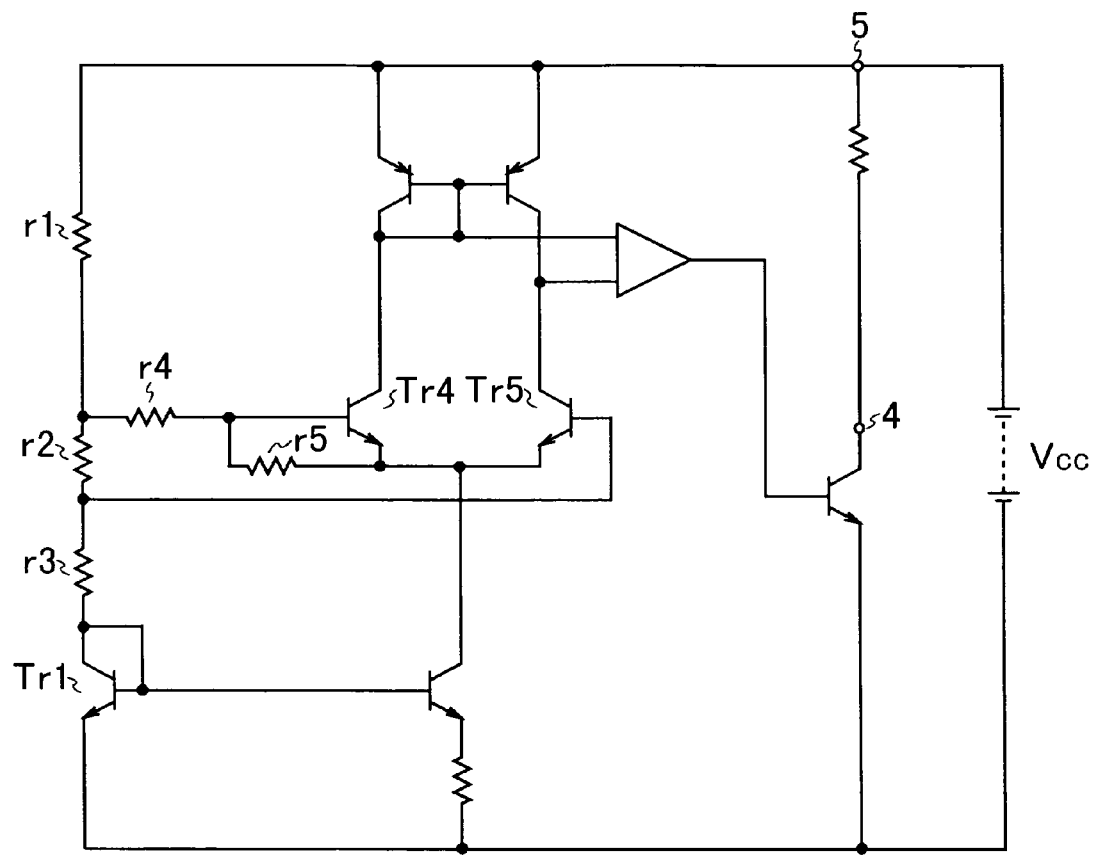
FIG. 4 is a diagram showing an example of the configuration of a conventional voltage detection circuit.

Next, a description will be given of why it is preferable to use PNP-type transistors as the differential pair transistors for voltage detection (i.e., the transistors Q1 and Q2 in FIG. 1) and as the diode-connected transistor provided in the voltage division circuit (i.e., the transistor Q3 in FIG. 1). When an NPN-type transistor is formed in a low-concentration N-type epitaxial layer, it has a vertical structure in which an emitter layer, a baser layer, and a collector layer are vertically arranged as shown in FIG. 2. By contrast, when a PNP-type transistor is formed in a low-concentration N-type epitaxial layer, it has a horizontal structure in which an emitter layer, a baser layer, and a collector layer are horizontally arranged as shown in FIG. 3. In FIGS. 2 and 3, the following symbols are used: "B" represents a base contact; "C" represents a collector contact; "E" represents an emitter contact; "N$^+$" represents a high-concentration N-type diffusion layer; "N$^-$" represents a low-concentration N-type epitaxial layer; and "P$^+$" represents a high-concentration P-type diffusion layer.

In the NPN-type transistor shown in FIG. 2, since the base layer is a high-concentration P-type diffusion layer, it has a small resistive component. By contrast, in the PNP-type transistor shown in FIG. 3, since the base layer is a low-concentration N-type epitaxial layer, it has a large resistive component. Whereas the resistive component in the base layer exhibits a positive temperature characteristic, the base-emitter junction potential exhibits a negative temperature characteristic. Thus, the temperature-related variation of the base-emitter voltage is smaller in a PNP-type transistor, in which the base layer resistive component is large, than in an NPN-type transistor, in which the base layer resistive component is small. For this reason, it is easier to set the temperature coefficient of the reference level for voltage detection to be equal to zero when PNP-transistors are used as the differential pair transistors for voltage detection (i.e., the transistors Q1 and Q2 in FIG. 1) and as the diode-connected transistor provided in the voltage division circuit (i.e., the transistor Q3 in FIG. 1) than when NPN-type transistor are used instead.

The voltage detection circuit shown in FIG. 1 is typically incorporated in a semiconductor integrated circuit device, which is fabricated through a combination of various processes such as film formation, lithography, etching, and impurity doping. Here, it is preferable that the resistors R1 to R4 be formed simultaneously by the same process. By forming the resistors R1 to R4 by the same process, even if the individual resistances $R_1$ to $R_4$ deviate from their design values, it is possible to minimize the deviations in the ratios between them (for example $R_1/R_2$). This also helps, as will be clear from Equation (6) noted above, to minimize the deviation in the temperature coefficient $\partial V_S/\partial T$ of the threshold level $V_S$ from its set value.

In the voltage detection circuit shown in FIG. 1, between the input terminal 1 and the resistor R1 is provided the transistor Q3 having the base and collector thereof short-circuited together. It is, however, also possible to connect the input terminal 1 directly to the resistor R1 and connect the transistor Q3 having the base and collector thereof short-circuited together between the resistors R1 and R2. It is also possible to use the transistor Q3 as the reference source of a current mirror circuit. For example, it is possible to use as the constant current source 2 a PNP-type transistor that together with the transistor Q3 forms a current mirror circuit.

What is claimed is:

1. A voltage detection circuit comprising:
   a first transistor and a second transistor that have emitters thereof connected together to form a differential pair;
   a voltage division circuit that divides an input voltage into a first division voltage and a second division voltage, the voltage division circuit being connected directly to a base of the first transistor to apply the first division voltage to the base of the first transistor, the voltage division circuit being connected directly to a base of the second transistor to apply the second division voltage to the base of the second transistor; and
   a first resistor that has one end thereof connected to the base of the second transistor and that has another end thereof connected to the emitter of the second transistor,
   wherein whether the input voltage is equal to a predetermined level or not is checked based on an output from the differential pair,
   wherein the first and second transistors are both of a PNP type,
   wherein the voltage division circuit consists of:
   a serial circuit composed of a rectifying element and a second resistor;
   a third resistor; and
   a fourth resistor, and
   wherein the input voltage is applied to one end of the serial circuit, another end of the serial circuit is connected to one end of the third resistor, another end of the third resistor is connected to one end of the fourth resistor, another end of the fourth resistor is connected to ground, the first division voltage is outputted from a node between the serial circuit and the third resistor, and the second division voltage is outputted from a node between the third resistor and the fourth resistor.

2. A voltage detection circuit as claimed in claim 1, wherein, when the input voltage is equal to the predetermined level, a voltage across the rectifying element is equal to a base-emitter voltage of the second transistor.

3. A voltage detection circuit as claimed in claim 2, wherein the predetermined level is equal to a sum of a first multiplication product and a second multiplication product,
   the first multiplication product being a product obtained by multiplying
      a differential voltage between a base-emitter voltage of the first transistor and the base-emitter voltage of the second transistor as observed when the differential pair is in a state of equilibrium by
      a value obtained by dividing a sum of resistances of the second, third, and fourth resistors by the resistance of the third resistor,
   the second multiplication product being a product obtained by multiplying
      the base-emitter voltage of the second transistor by
      a value obtained by dividing a sum of the resistance of the fourth resistor and a resistance of the first resistor by the resistance of the first resistor.

4. A voltage detection circuit as claimed in claim 1 further comprising:
   an output transistor that is turned on and off according to an output from the differential pair,
   wherein the voltage detection circuit outputs as a reset signal an output of the output transistor.

5. A semiconductor integrated circuit device including a voltage detection circuit, the voltage detection circuit comprising:
   a first transistor and a second transistor that have emitters thereof connected together to form a differential pair;
   a voltage division circuit that divides an input voltage into a first division voltage and a second division voltage, the voltage division circuit being connected directly to a base of the first transistor to apply the first division voltage to the base of the first transistor, the voltage division circuit being connected directly to a base of the second transistor to apply the second division voltage to the base of the second transistor; and
   a first resistor that has one end thereof connected to the base of the second transistor and that has another end thereof connected to the emitter of the second transistor,
   wherein whether the input voltage is equal to a predetermined level or not is checked based on an output from the differential pair,
   wherein the first and second transistors are both PNP-type transistors,
   wherein the voltage division circuit consists of:
   a serial circuit composed of a rectifying element and a second resistor;
   a third resistor; and
   a fourth resistor, and
   wherein the input voltage is applied to one end of the serial circuit, another end of the serial circuit is connected to one end of the third resistor, another end of the third resistor is connected to one end of the fourth resistor, another end of the fourth resistor is connected to ground, the first division voltage is outputted from a node between the serial circuit and the third resistor, and the second division voltage is outputted from a node between the third resistor and the fourth resistor.

6. A semiconductor integrated circuit device as claimed in claim 5,
   wherein, when the input voltage is equal to the predetermined level, a voltage across the rectifying element is equal to a base-emitter voltage of the second transistor.

7. A semiconductor integrated circuit device as claimed in claim 6,
wherein the predetermined voltage is equal to a sum of a first multiplication product and a second multiplication product,
the first multiplication product being a product obtained by multiplying
a differential voltage between a base-emitter voltage of the first transistor and the base-emitter voltage of the second transistor as observed when the differential pair is in a state of equilibrium by
a value obtained by dividing a sum of resistances of the second, third, and fourth resistors by the resistance of the third resistor,
the second multiplication product being a product obtained by multiplying
the base-emitter voltage of the second transistor by
a value obtained by dividing a sum of the resistance of the fourth resistor and a resistance of the first resistor by the resistance of the first resistor.

8. A semiconductor integrated circuit device as claimed in claim 5, further comprising:
an output transistor that is turned on and off according to an output from the differential pair,
wherein the semiconductor integrated circuit device outputs as a reset signal an output of the output transistor.

9. A method for fabricating a semiconductor integrated circuit device,
the semiconductor integrated circuit device including a voltage detection circuit,
the voltage detection circuit comprising:
a first transistor and a second transistor, both of a PNP type, that have emitters thereof connected together to form a differential pair;
a voltage division circuit consisting of a serial circuit composed of a rectifying element and a second resistor, a third resistor, and a fourth resistor, the voltage division circuit dividing an input voltage into a first division voltage and a second division voltage, the voltage division circuit being connected directly to a base of the first transistor to apply the first division voltage to the base of the first transistor, the voltage division circuit being connected directly to a base of the second transistor to apply the second division voltage to the base of the second transistor; and
a resistor that has one end thereof connected to the base of the second transistor and that has another end thereof connected to the emitter of the second transistor,
wherein whether the input voltage is equal to a predetermined level or not is checked based on an output from the differential pair, and
wherein the input voltage is applied to one end of the serial circuit, another end of the serial circuit is connected to one end of the third resistor, another end of the third resistor is connected to one end of the fourth resistor, another end of the fourth resistor is connected to ground, the first division voltage is outputted from a node between the serial circuit and the third resistor, and the second division voltage is outputted from a node between the third resistor and the fourth resistor,
the method comprising a step of forming the resistor, the second resistor, the third resistor, and the fourth resistor simultaneously by a same process.

10. A method for fabricating a semiconductor integrated circuit device as claimed in claim 9,
wherein the semiconductor integrated circuit device is so configured that, when the input voltage is equal to the predetermined level a voltage across the rectifying element is equal to a base-emitter voltage of the second transistor.

11. A method for fabricating a semiconductor integrated circuit device as claimed in claim 10,
wherein the semiconductor integrated circuit device is so configured that the predetermined level is equal to a sum of a first multiplication product and a second multiplication product,
the first multiplication product being a product obtained by multiplying
a differential voltage between a base-emitter voltage of the first transistor and the base-emitter voltage of the second transistor as observed when the differential pair is in a state of equilibrium by
a value obtained by dividing a sum of resistances of the second, third, and fourth resistors by the resistance of the third resistor, the second multiplication product being a product obtained by multiplying
the base-emitter voltage of the second transistor by
a value obtained by dividing a sum of the resistance of the fourth resistor and a resistance of the first resistor by the resistance of the first resistor.

* * * * *